US 11,740,261 B2

(12) United States Patent
Peretto et al.

(10) Patent No.: US 11,740,261 B2
(45) Date of Patent: Aug. 29, 2023

(54) CAPACITIVE VOLTAGE SENSOR ASSEMBLY

(71) Applicant: G & W Electric Company, Bolingbrook, IL (US)

(72) Inventors: Lorenzo Peretto, Rovigo (IT); Alberto Bauer, Dubai (AE)

(73) Assignee: G & W Electric Company, Bolingbrook, IL (US)

( * ) Notice: Subject to any disclaimer, the term of this patent is extended or adjusted under 35 U.S.C. 154(b) by 126 days.

(21) Appl. No.: 16/952,990

(22) Filed: Nov. 19, 2020

(65) Prior Publication Data
US 2021/0072289 A1 Mar. 11, 2021

Related U.S. Application Data

(63) Continuation of application No. 16/340,498, filed as application No. PCT/IT2017/000225 on Oct. 12, 2017, now Pat. No. 10,852,324.

(30) Foreign Application Priority Data

Oct. 14, 2016 (IT) .................. 102016000103234

(51) Int. Cl.
*G01R 15/16* (2006.01)
(52) U.S. Cl.
CPC .................. *G01R 15/165* (2013.01)
(58) Field of Classification Search
CPC ................................................... G01R 15/165
See application file for complete search history.

(56) References Cited

U.S. PATENT DOCUMENTS

| 3,396,339 A | 8/1968 | Miram |
| 3,835,353 A | 9/1974 | Hermstein et al. |
| 4,241,373 A | 12/1980 | Mara et al. |

(Continued)

FOREIGN PATENT DOCUMENTS

| CN | 105588966 A | 5/2016 |
| CN | 105467187 B | 5/2018 |

(Continued)

OTHER PUBLICATIONS

International Search Report and Written Opinion for International Application No. PCT/IT2018/000037 dated Jul. 17, 2018 (9 pages).

(Continued)

*Primary Examiner* — Clayton E. LaBalle
*Assistant Examiner* — Michael A Harrison
(74) *Attorney, Agent, or Firm* — Michael Best & Friedrich LLP

(57) ABSTRACT

A capacitive voltage sensor assembly includes an electrode extending along a longitudinal axis, the electrode having a first end and a second end opposite the first end, and a tubular shield surrounding and spaced radially outward from a portion of the electrode. The tubular shield includes a plurality of through holes. The sensor assembly also includes a circular sensor element positioned radially inward of the tubular shield and including a first layer made of electrically conductive material and a second layer made of electrically insulating material. The circular sensor element includes a plurality of circumferentially spaced gaps.

42 Claims, 6 Drawing Sheets

(56) References Cited

U.S. PATENT DOCUMENTS

| | | |
|---|---|---|
| 4,268,889 A | 5/1981 | Wolfendale |
| 4,700,123 A | 10/1987 | Beling |
| 5,136,241 A | 8/1992 | Blank et al. |
| 5,661,240 A | 8/1997 | Kemp |
| 5,991,177 A | 11/1999 | Kaczkowski |
| 6,252,388 B1 | 6/2001 | Jaeger et al. |
| 6,307,385 B1 | 10/2001 | Tardif et al. |
| 7,466,146 B2 | 12/2008 | Stewart et al. |
| 7,541,816 B1 | 6/2009 | Liao et al. |
| 7,595,648 B2 | 9/2009 | Ungaretti et al. |
| 8,242,840 B2 | 8/2012 | Van Veldhoven |
| 8,283,934 B2 | 10/2012 | Nishizono |
| 8,294,477 B2 | 10/2012 | Handshoe et al. |
| 8,446,157 B2 | 5/2013 | Fröjd |
| 8,847,353 B2 | 9/2014 | Hasunuma |
| 9,118,330 B2 | 8/2015 | Beyly et al. |
| 9,291,651 B2 | 3/2016 | Bauer |
| 9,389,246 B2 | 7/2016 | Juds et al. |
| 9,568,506 B2 | 2/2017 | Fujinoki |
| 9,696,348 B2 | 7/2017 | Juds et al. |
| 9,739,807 B2 | 8/2017 | Barba Jimenez |
| 9,739,816 B2 | 8/2017 | Flanagan |
| 9,739,820 B2 | 8/2017 | Gravermann et al. |
| 9,742,180 B2 | 8/2017 | Wentzel et al. |
| 9,846,024 B1 | 12/2017 | Noras |
| 9,921,246 B2 | 3/2018 | Bauer |
| 9,927,415 B2 | 3/2018 | Baumann et al. |
| 9,958,505 B2 | 5/2018 | Honda |
| 9,983,032 B1 | 5/2018 | Kraver et al. |
| 10,025,423 B2 | 7/2018 | Aas et al. |
| 10,088,963 B2 | 10/2018 | Otagaki et al. |
| 10,203,814 B2 | 2/2019 | Ryynanen et al. |
| 10,215,778 B2 | 2/2019 | Gravermann et al. |
| 10,317,442 B2 | 6/2019 | Kawaguchi et al. |
| 10,338,103 B2 | 7/2019 | Gravermann et al. |
| 10,345,340 B2 | 7/2019 | Gravermann et al. |
| 10,425,079 B1 | 9/2019 | Bytheway |
| 10,591,523 B2 | 3/2020 | Pak et al. |
| 10,753,962 B2 | 8/2020 | Testa et al. |
| 10,790,822 B2 | 9/2020 | Wendt et al. |
| 11,048,367 B2 | 6/2021 | Reynolds et al. |
| 11,079,410 B2 | 8/2021 | Bauer et al. |
| 11,287,456 B2 | 3/2022 | Wang et al. |
| 11,346,876 B2 | 5/2022 | Bauer |
| 11,378,594 B2 | 7/2022 | Djogo |
| 11,415,611 B2 | 8/2022 | Zhang et al. |
| 2001/0048308 A1 | 12/2001 | Potter et al. |
| 2002/0113596 A1 | 8/2002 | Horie et al. |
| 2005/0122118 A1 | 6/2005 | Zank et al. |
| 2006/0033508 A1 | 2/2006 | Lee |
| 2006/0119369 A1 | 6/2006 | Kawahata et al. |
| 2006/0238233 A1 | 10/2006 | Kraus |
| 2007/0086130 A1 | 4/2007 | Sorensen |
| 2008/0011093 A1 | 1/2008 | Shank et al. |
| 2010/0107775 A1* | 5/2010 | Wang .................. G01F 1/56 73/861.08 |
| 2010/0283487 A1 | 11/2010 | Juds et al. |
| 2010/0318306 A1 | 12/2010 | Tierney et al. |
| 2011/0012623 A1 | 1/2011 | Gastel et al. |
| 2011/0121820 A1 | 5/2011 | Handshoe et al. |
| 2011/0121842 A1 | 5/2011 | Bauer et al. |
| 2011/0204879 A1 | 8/2011 | Peretto |
| 2011/0205683 A1 | 8/2011 | Peretto |
| 2011/0221452 A1 | 9/2011 | Shyue |
| 2011/0234311 A1 | 9/2011 | Hirashiki et al. |
| 2011/0298454 A1 | 12/2011 | Ausserlechner |
| 2012/0261384 A1 | 10/2012 | LaBianco et al. |
| 2012/0326734 A1 | 12/2012 | Cho et al. |
| 2013/0043891 A1 | 2/2013 | Handshoe et al. |
| 2014/0300374 A1 | 10/2014 | McKenzie et al. |
| 2014/0354302 A1 | 12/2014 | Lu et al. |
| 2014/0370741 A1 | 12/2014 | Bolcato et al. |
| 2015/0279642 A1 | 10/2015 | Prance |
| 2015/0346907 A1 | 12/2015 | Nakajima et al. |
| 2016/0005511 A1 | 1/2016 | Gravermann et al. |
| 2016/0061864 A1 | 3/2016 | White et al. |
| 2016/0103174 A1 | 4/2016 | Aaltonen et al. |
| 2016/0139181 A1 | 5/2016 | Gravermann et al. |
| 2016/0202286 A1 | 7/2016 | Aaltonen et al. |
| 2016/0245845 A1* | 8/2016 | Alberto .................. G01R 3/00 |
| 2017/0030946 A1 | 2/2017 | Gravermann et al. |
| 2017/0038414 A1 | 2/2017 | Barba Jimenez |
| 2017/0061187 A1 | 3/2017 | Wen |
| 2017/0067938 A1 | 3/2017 | Kasai |
| 2017/0067939 A1 | 3/2017 | Imai et al. |
| 2017/0184634 A1 | 6/2017 | Wentzel |
| 2017/0234908 A1 | 8/2017 | Gravermann et al. |
| 2017/0250499 A1 | 8/2017 | Sica et al. |
| 2017/0276723 A1 | 9/2017 | Buffa et al. |
| 2017/0363660 A1 | 12/2017 | Gravermann |
| 2018/0092557 A1 | 4/2018 | Bickford et al. |
| 2018/0100878 A1 | 4/2018 | Pearce et al. |
| 2018/0292435 A1 | 10/2018 | Wentzel et al. |
| 2018/0374644 A1 | 12/2018 | Stollwerck et al. |
| 2019/0146006 A1 | 5/2019 | Sanchez Ruiz et al. |
| 2019/0181860 A1 | 6/2019 | Cholasta |
| 2019/0234995 A1 | 8/2019 | Peretto |
| 2019/0237260 A1 | 8/2019 | Stollwerck et al. |
| 2019/0324073 A1 | 10/2019 | Mikami |
| 2020/0064376 A1 | 2/2020 | Loyd et al. |
| 2020/0124642 A1 | 4/2020 | Djogo |
| 2020/0158762 A1 | 5/2020 | Wilson et al. |
| 2020/0200936 A1 | 6/2020 | Kruger |
| 2020/0256896 A1 | 8/2020 | Bauer et al. |
| 2021/0018537 A1 | 1/2021 | Bauer |
| 2021/0072289 A1 | 3/2021 | Peretto et al. |
| 2021/0206418 A1 | 7/2021 | Nakano et al. |
| 2021/0302478 A1 | 9/2021 | Kapoor et al. |
| 2021/0356499 A1 | 11/2021 | Ferraro et al. |
| 2021/0359533 A1 | 11/2021 | Hatano |
| 2022/0043033 A1 | 2/2022 | Bauer |
| 2022/0065910 A1 | 3/2022 | Ellis, Jr. et al. |
| 2022/0123748 A1 | 4/2022 | Willis et al. |
| 2022/0311441 A1 | 9/2022 | Liu |
| 2022/0317158 A1 | 10/2022 | Stollwerck et al. |

FOREIGN PATENT DOCUMENTS

| | | | |
|---|---|---|---|
| DE | 2149881 A1 | 2/1973 | |
| DE | 19613688 A1 | 10/1997 | |
| DE | 102017000723 A1 | 5/2018 | |
| EP | 0677747 A2 | 10/1995 | |
| EP | 0912902 A1 | 5/1999 | |
| EP | 2366108 B1 | 8/2012 | |
| EP | 2993480 A1 | 3/2016 | |
| EP | 3513202 A1 | 7/2019 | |
| EP | 3828553 A1 | 6/2021 | |
| EP | 3840135 A1 | 6/2021 | |
| EP | 3862760 A1 | 8/2021 | |
| EP | 3881085 A4 | 9/2021 | |
| EP | 3913379 A1 | 11/2021 | |
| EP | 4058815 A1 | 9/2022 | |
| ES | 2221551 A1 | 12/2004 | |
| GB | 967853 A | 8/1964 | |
| GB | 2203557 A | 10/1988 | |
| WO | 2009153824 A1 | 12/2009 | |
| WO | 2010070693 A1 | 6/2010 | |
| WO | 2011033548 A1 | 3/2011 | |
| WO | 2011157047 A8 | 1/2013 | |
| WO | 2013026423 A1 | 2/2013 | |
| WO | 2013042155 A2 | 3/2013 | |
| WO | 2011125725 A1 | 7/2013 | |
| WO | WO-2015044972 A1 * | 4/2015 | ......... B29C 33/0061 |
| WO | 2016109009 A1 | 7/2016 | |
| WO | 2017050039 A1 | 3/2017 | |
| WO | 2017050042 A1 | 3/2017 | |
| WO | 2017050044 A1 | 3/2017 | |
| WO | 2017050045 A1 | 3/2017 | |
| WO | 2017050058 A1 | 3/2017 | |
| WO | 2018069949 A2 | 4/2018 | |
| WO | 2018096567 A2 | 5/2018 | |
| WO | 2018114661 A1 | 6/2018 | |
| WO | 2018179017 A1 | 10/2018 | |
| WO | 2019073497 A1 | 4/2019 | |

(56) References Cited

FOREIGN PATENT DOCUMENTS

| | | |
|---|---|---|
| WO | 2019186607 A1 | 10/2019 |
| WO | 2020109283 A2 | 6/2020 |
| WO | 2020131903 A1 | 6/2020 |
| WO | 2020131909 A1 | 6/2020 |
| WO | 2021061153 A1 | 4/2021 |
| WO | 2021180642 A1 | 9/2021 |
| WO | 2022069967 A1 | 4/2022 |
| WO | 2022072130 A1 | 4/2022 |
| WO | 2022094645 A1 | 5/2022 |
| WO | 2022124942 A1 | 6/2022 |

OTHER PUBLICATIONS

International Search Report and Written Opinion for International Application No. PCT/IT2017/000225 dated Apr. 5, 2018 (11 pages).
International Preliminary Report on Patentability for Application No. PCT/IT2019/000023 dated Oct. 15, 2020 (7 pages).
International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).

\* cited by examiner

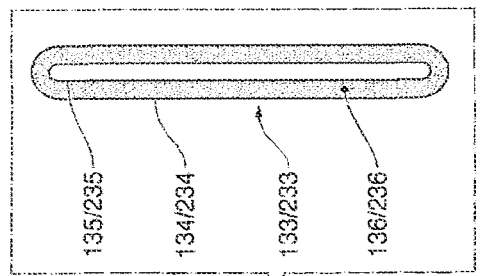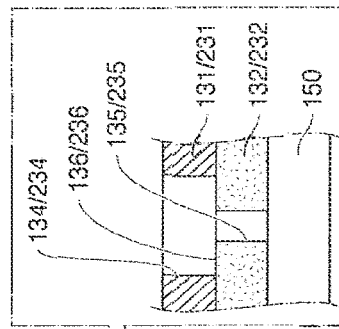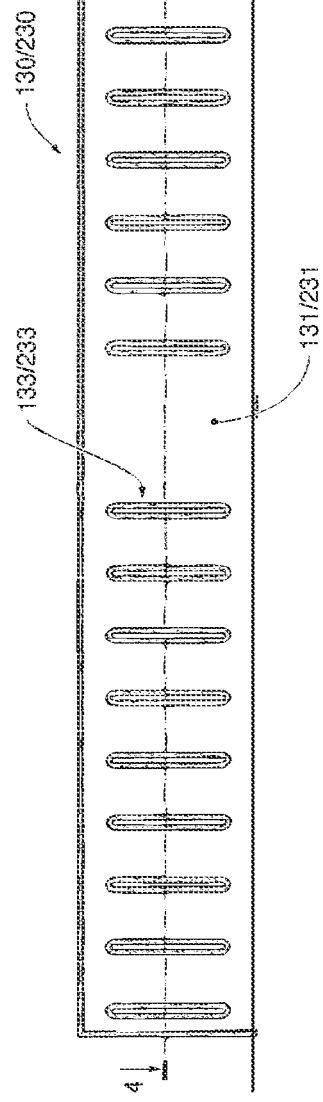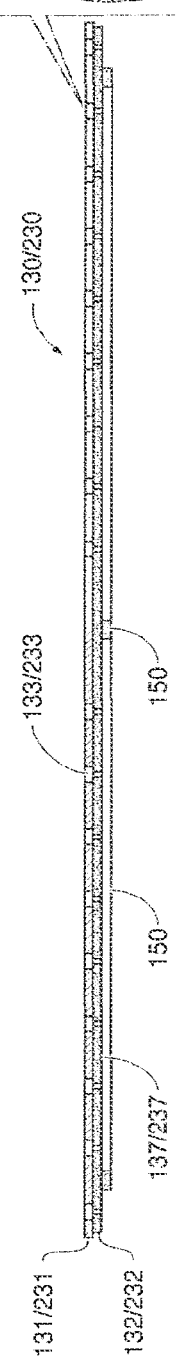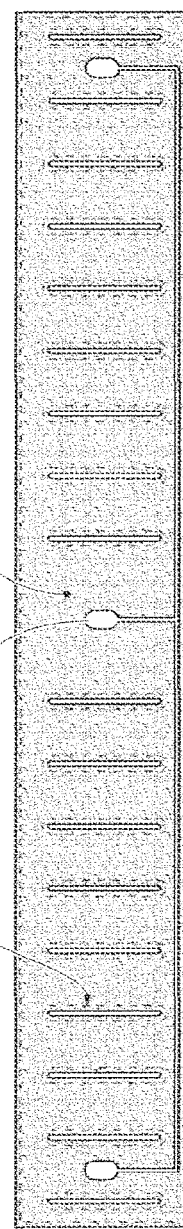
Fig. 3
Fig. 4
Fig. 5

US 11,740,261 B2

CAPACITIVE VOLTAGE SENSOR ASSEMBLY

CROSS-REFERENCE TO RELATED APPLICATIONS

This application is a continuation of co-pending U.S. patent application Ser. No. 16/340,498, filed Apr. 9, 2019, which is a U.S. national stage of PCT Patent Application No. PCT/IT2017/000225, filed Oct. 12, 2017, which claims priority to Italian Patent Application No. 102016000103234, filed Oct. 14, 2016, the entire content of all of which are incorporated herein by reference.

FIELD OF THE INVENTION

The present invention relates to a constructive system comprising a capacitive voltage sensor, wherein said sensor detects the electric field generated by a voltage element of the same capacitive sensor, for example, to determine the voltage value of said live element.

More particularly, the present invention relates to a constructive system comprising a capacitive voltage sensor, in which said sensor detects the electric field generated by a voltage element of the same sensor without affecting any surrounding electric and/or magnetic fields, such as, for example, the electromagnetic fields generated by other conductors and/or other nearby bars.

BACKGROUND

At the present the known capacitive voltage sensors have a number of drawbacks.

A first drawback is due to the fact that the resin of dielectric material disposed around the sensor components includes vacuoles (air bubbles) with consequent phenomena of unwanted partial discharges.

Another disadvantage is due to the fact that the same resin is detached from the elements that make up the capacitive sensor with consequent phenomena of unwanted partial discharges.

A third drawback is due to the fact that said resin is not perfectly adherent and/or not perfectly clamped and/or constrained with respect to the organs constituting the capacitive sensor and, therefore, as a result of aging, there are discontinuities between said resin and the organs quoted, with consequent phenomena of unwanted partial discharges. This disadvantage is particularly present when the capacitive sensor is used in an environment where the operating temperature (hot/cold) varies cyclically.

With reference to the facts of the invention, the following documents are cited: WO_2010/070.693.A1, CN_105.588.966.A and U.S. Pat. No. 6,252,388.B1.

SUMMARY

It is therefore an object of the present invention to solve the aforementioned drawbacks.

The invention, provides, in one aspect, a capacitive voltage sensor assembly including an electrode extending along a longitudinal axis, the electrode having a first end and a second end opposite the first end, and a tubular shield surrounding and spaced radially outward from a portion of the electrode. The tubular shield includes a plurality of through holes. The sensor assembly also includes a circular sensor element positioned radially inward of the tubular shield and including a first layer made of electrically conductive material and a second layer made of electrically insulating material. The circular sensor element includes a plurality of circumferentially spaced gaps.

The invention provides, in another aspect, a capacitive voltage sensor assembly including an electrode extending along a longitudinal axis, the electrode having a first end and a second end opposite the first end, and a tubular shield surrounding and spaced radially outward from a portion of the electrode. The tubular shield is adjacent to the second end of the electrode and includes a plurality of regularly spaced through holes and has a first end and a second end opposite the first end. The sensor assembly also includes a circular sensor element positioned radially inward of the tubular shield. The circular sensor element includes a first layer of electrically conductive material and a second layer of electrically insulating material, and the second layer of electrically insulating material is positioned between the tubular shield and the first layer of electrically conductive material. The circular sensor element includes a plurality of circumferentially spaced gaps. The sensor assembly also includes a mass of dielectric material surrounding the tubular shield and the circular sensor element. The mass of dielectric insulating material fills the plurality of regularly spaced through holes in the tubular shield and the plurality of circumferentially spaced gaps in the circular sensor element.

The invention provides, in another aspect, a capacitive voltage sensor assembly including a source electrode extending along a longitudinal axis, the source electrode having a first end and a second end opposite the first end, and a flexible tubular shield surrounding and spaced radially outward from a portion of the source electrode. The tubular shield includes a plurality of regularly spaced through holes configured in a mesh-like network, and the tubular shield has a first end and a second end opposite the first end. The sensor assembly also includes a circular sensor element positioned radially inward of the tubular shield. The circular sensor element includes a first layer of electrically conductive material and a second layer of electrically insulating material positioned between the tubular shield and the first layer of electrically conductive material. The circular sensor element includes a plurality of circumferentially spaced gaps, and each gap of the plurality of gaps has a length that extends in a direction parallel to the longitudinal axis. The tubular shield, the first layer of electrically conductive material, and the second layer of insulating material are positioned adjacent the second end of the source electrode and spaced apart from the first end of the source electrode. The first layer of electrically conductive material is configured to form a capacitive coupling with the source electrode, and the second layer of electrically insulating material is configured to electrically isolate the first layer of electrically conductive material from the tubular shield.

BRIEF DESCRIPTION OF THE DRAWINGS

Further features and advantages of the present invention will be more evident from the following description of some of its preferred embodiments, here given merely by way of non-limiting example, with reference to the accompanying drawings in which:

FIGS. 3, 4 and 5 illustrate in schematic manner and as planarly view a possible and preferred embodiment of a structure for forming an electric field sensor prior to its insertion into a shielding tubular body, in which FIG. 4 is a cross-sectional view with respect to the line 4-4 of FIG. 3;

DETAILED DESCRIPTION

With reference to the accompanying drawings, the constructive system object of the present invention is able to provide a capacitive electrical voltage sensor, wherein said sensor extends along an axis Y defined longitudinal.

Figure 1:
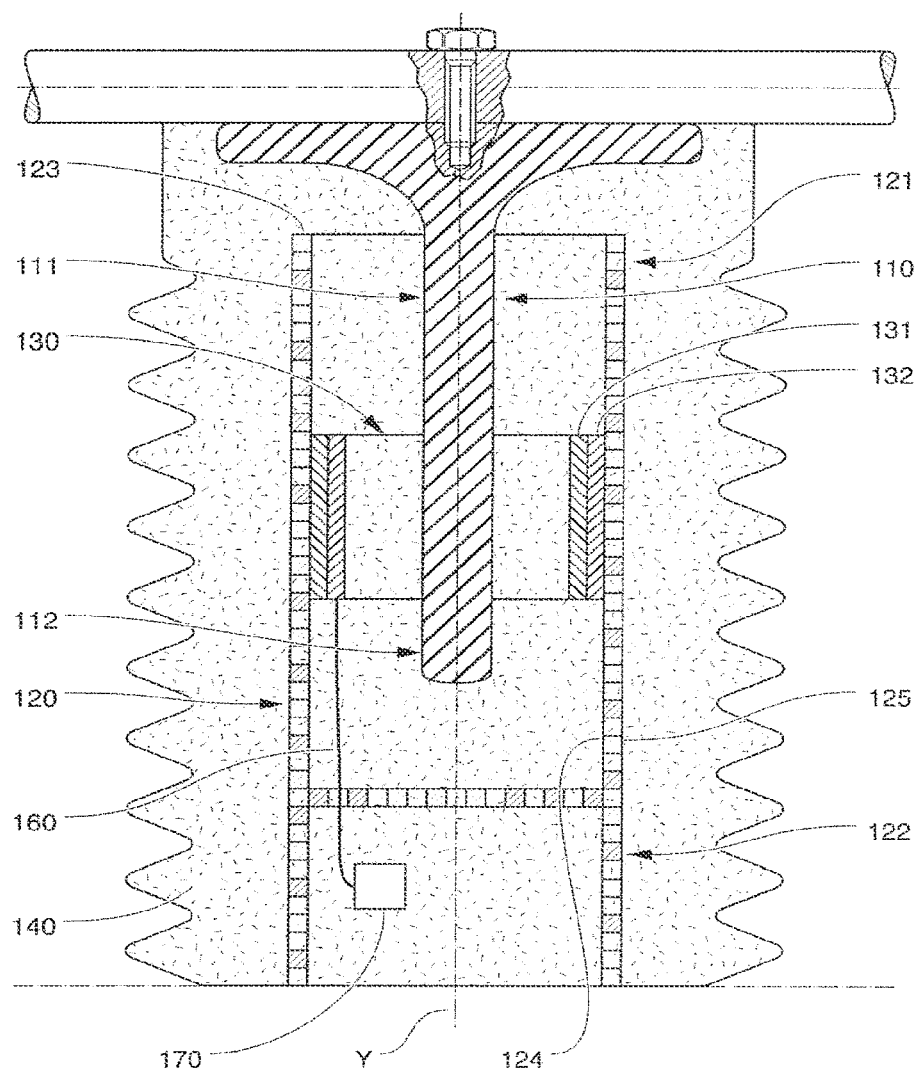
FIG. 1 illustrates a first embodiment of the constructive system object of the present invention, wherein said system is used to produce a capacitive voltage sensor.
Figure 2:
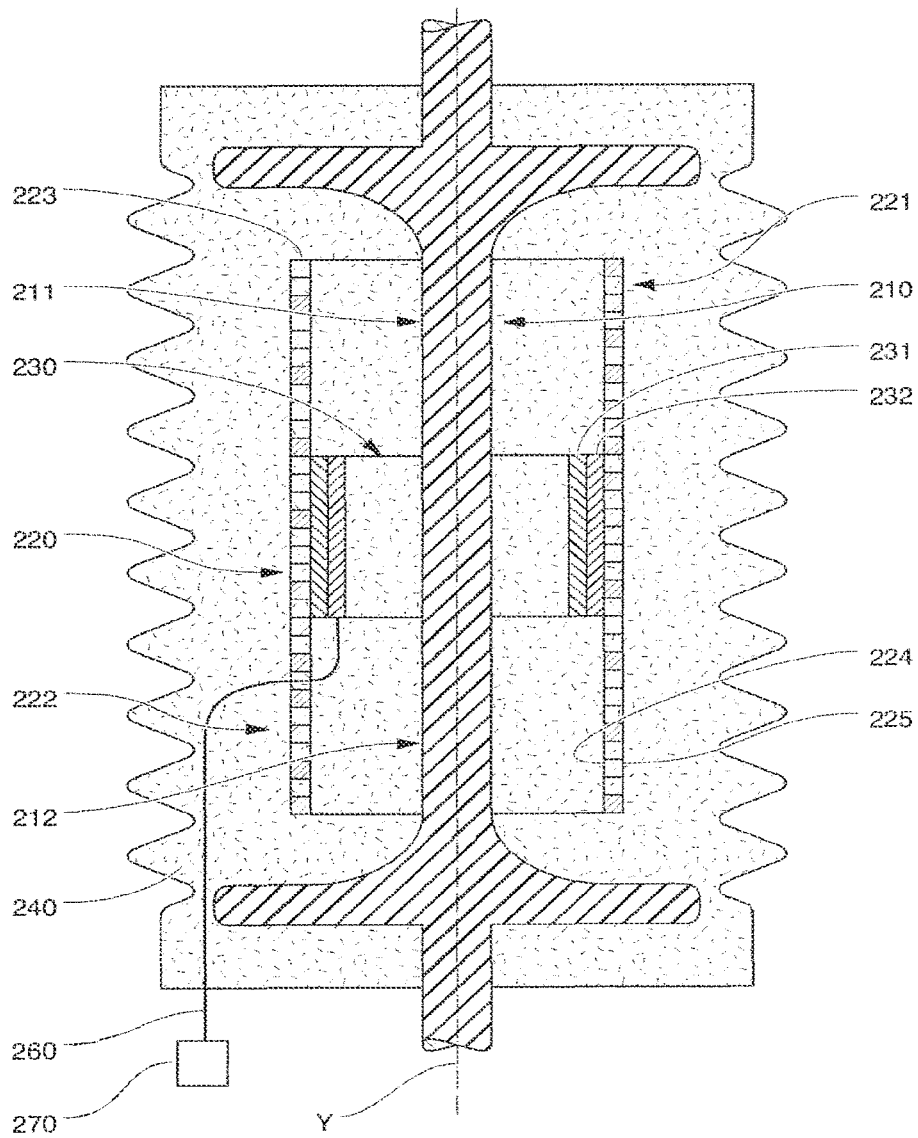
FIG. 2 illustrates a second embodiment of the constructive system object of the present invention, wherein said system is used to make a feedthrough able to also perform the function of capacitive voltage sensor.

With reference to FIGS. 1 and 2, this system substantially comprises a source electrode 110/210, a shielding tubular body 120/220, an electric field sensor 130/230, and a mass of dielectric insulating material 140/240.

With reference to said source electrode 110/210 it has an elongated shape extending longitudinally along a longitudinal axis Y, in such a way as to configure a first axial end portion 111/211 and a second opposite axial end portion 112/212, in which the latter is opposite with respect to the first axial end portion 111/211.

With reference to the shielding tubular body 120/220, it has an elongate shape extending longitudinally along a longitudinal axis Y, so as to configure a first axial end portion 121/221 and a second opposite axial end portion 122/222.

The shielding tubular body 120/220 is preferably grounded and it is able to shield the electric field sensor 130/230 with respect to the field lines generated by live voltage conductors positioned externally with respect to the capacitive sensor, so that the field sensor 130/230 detects the field lines generated by the source electrode 110/210.

Said shielding tubular body 120/220 comprises a tubular mantle 123/223, wherein said mantle 123/223, configures an inner face 124/224 and an outer face 125/225 with respect to the central axis Y.

With reference to the electric field sensor 130/230, said electric field sensor 130/230 is radially spaced with respect and around said source electrode 110/210 as well as positioned within said shielding tubular body 120/220 and preferably positioned in a intermediate point comprised between the first axial end portion 121/221 and the second axial end portion 122/222 of said screening tubular body 120/220.

With reference to the mass of dielectric insulating material 140/240, said mass is able to incorporate the various elements of the sensor and, primarily and substantially, said shielding tubular body 130/230, said source electrode 110/210 and said electric field sensor 130/230, in order to positioning said elements and in order to form an electrically insulated carrier structure.

Also referring to FIGS. 3, 4, 5 and 6, said electric field sensor 130/230 comprises at least one first inner sheet 131/231 and a second external sheet 132/232 which are superimposed and joined together, preferably as a monolithic structure, as best described below, wherein the first inner sheet 131/231 is made by means of an electrically conductive material (metallic) and the second external sheet 132/232 is made by means of an electrically insulating material.

With reference to the second outer sheet 132/232 made by insulating material it is preferably bonded to the inner face 124/224 of the shielding element 120/220, for example, by glue points positioned on the outer face of the sheet 132/232 and on the internal face 124/224 of the shielding tubular body 120/220, or by other systems as described below.

With reference to the first internal sheet 131/231 made by conductive material, it is able to detect the electric field lines generated by the source electrode 110/210 and, more particularly, it is intended to form a capacitive coupling between said source electrode 110/210 and said first sheet 131/231.

In this context, said first sheet 131/231 may take various forms and/or dimensions and/or sizes which can be different with respect to those illustrated in the figures, without departing from the inventive concept of the present invention.

With reference to the second outer sheet 132/232 made by insulating material, it is able to support the inner sheet 131/231 in place, as well as able to electrically insulating the inner sheet 131/231 with respect to the shielding tubular body 120/220 and therefore, said second sheet 132/232 may take shapes and/or thickness and/or size and/or conformations different with respect of those illustrated in the Figures without departing from the inventive concept of the present invention.

Figure 1A:
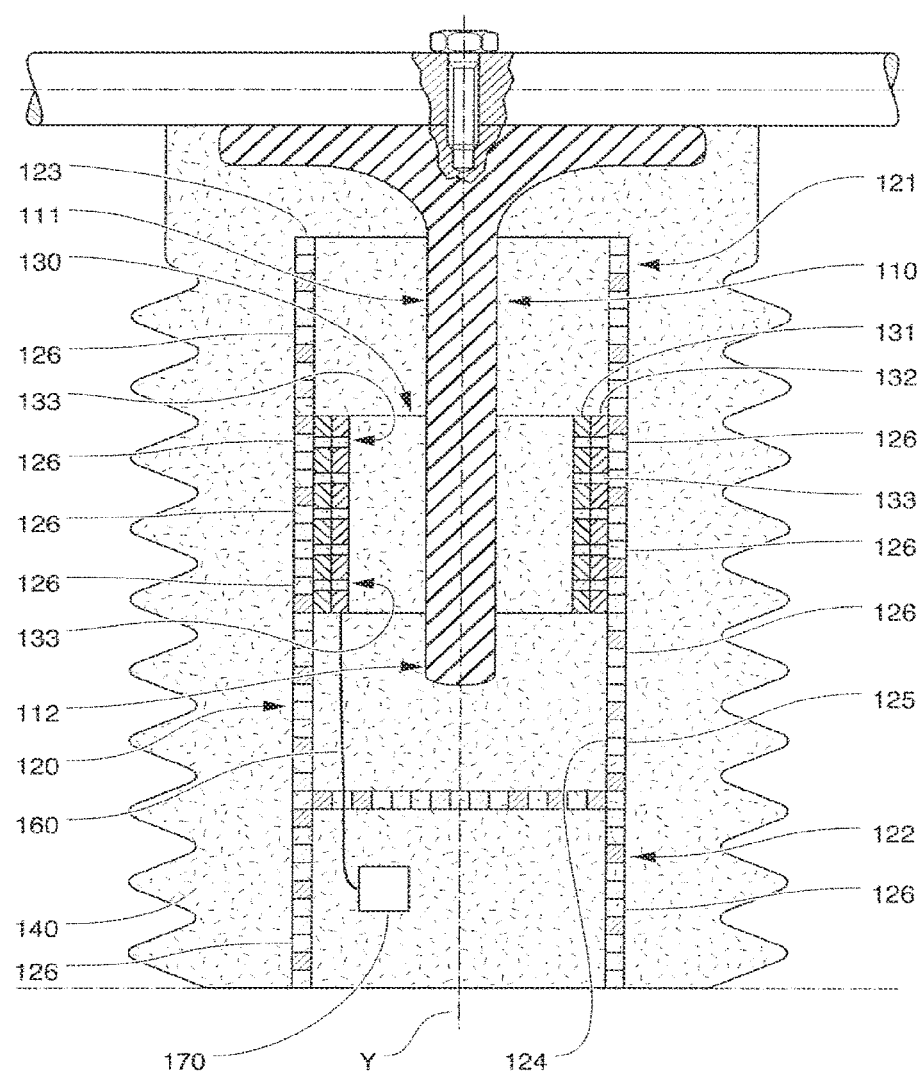
FIG. 1A illustrates a constructive variation of the system of the first embodiment of FIG. 1.
Figure 2A:
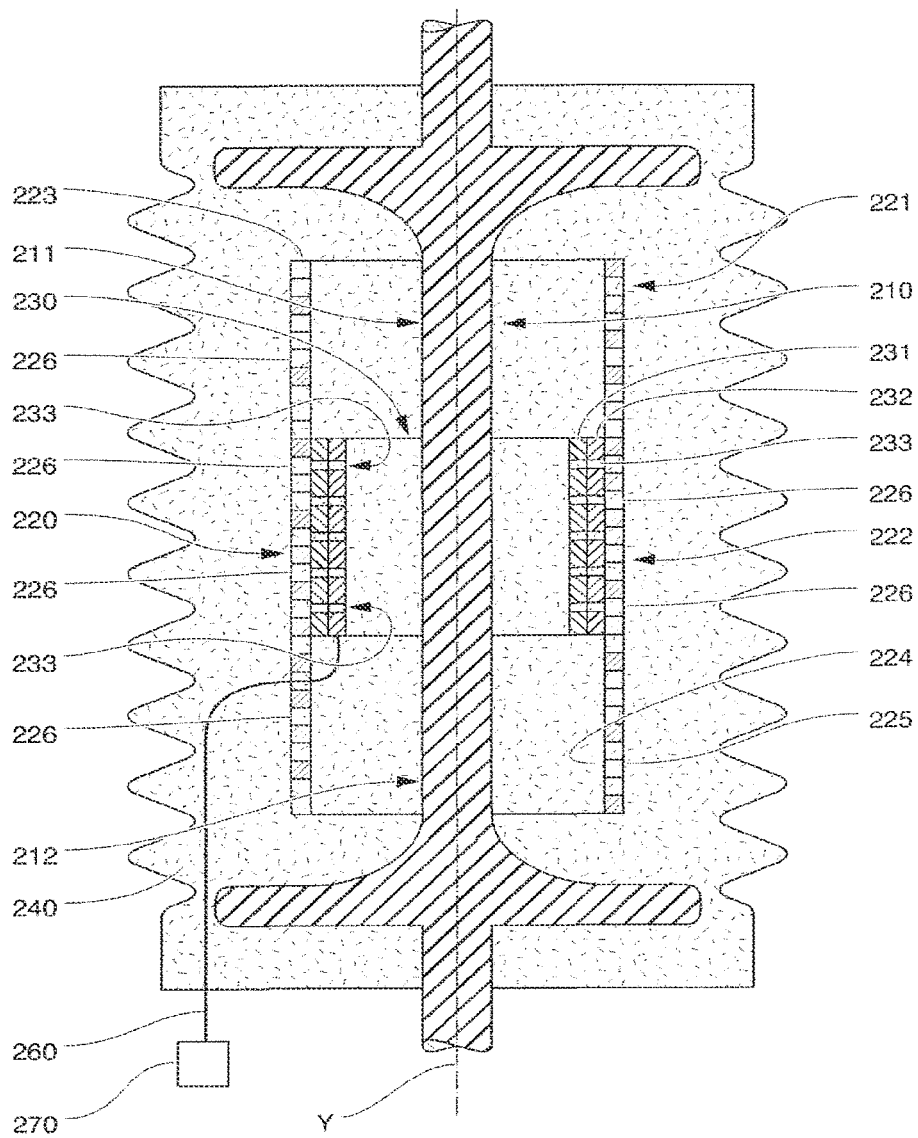
FIG. 2A illustrates a constructive variation of the system that relates to the second embodiment of FIG. 2.
Figure 6:
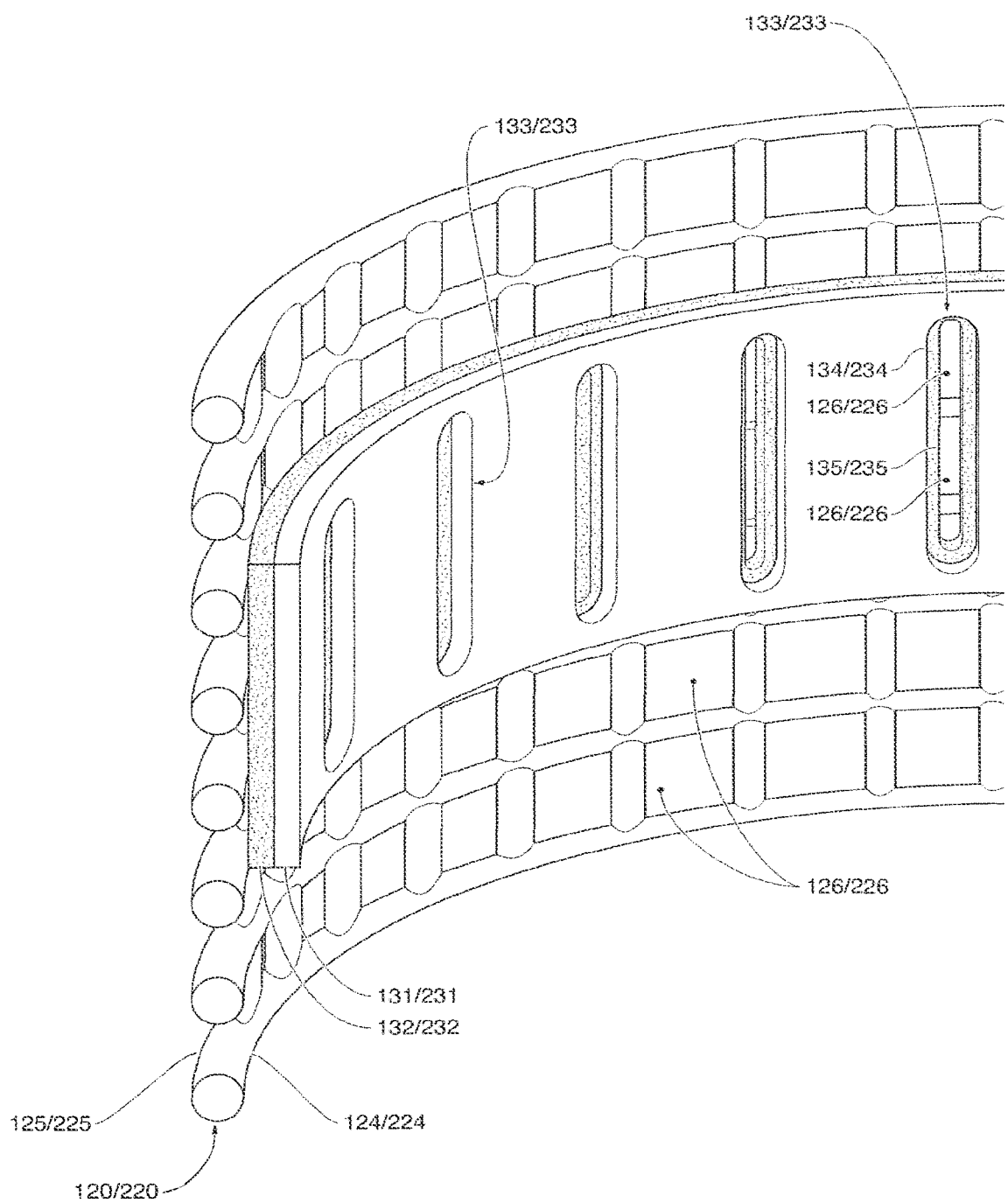
FIG. 6 illustrates schematically a constructive detail regarding the constructive variants of FIGS. 1A and 2A.

With particular reference to FIGS. 1A, 2A and 6, the shielding tubular body 120/220 is provided with first through holes 126/226, wherein said first through holes 126/226 have a width such that the resin can pass through the same first through holes 126/226 during the casting of the same resin while forming the sensor.

With reference to FIGS. 3, 4 and 5, said electric field sensor 130/230 is provided with second through holes 133/233, wherein said second through holes 133/233 have a width able to allow the passage of the resin through the same second holes 133/233 during its casting for forming the sensor.

With particular reference to FIG. 6, said first through holes 126/226 and said second through holes 133/233 are axially and mutually communicating, preferably axially aligned with each other, and in any case disposed in such a way as to allow the passage of the resin through said first 126/226 and said second 133/233 through holes during the casting of the same resin while forming the sensor.

With reference to FIG. 5, said electric field sensor may further comprise optional fixing means 150, which are applied to the external face 133/233 of the second outer sheet 132/232, wherein said fixing means 150 are designed to form a bond between the second sheet 132/232 and the inner face 124/224 of the shielding tubular body 120/220.

If the fixing means 150 are not present, the electric field sensor comprises only the inner sheet 131/231 and the external sheet 132/232, associated with them, provided with through holes 133/233, and in this case it is provided to fix the outer foil 132/232 with respect to and/or against the inner face 124/224 of the shielding tubular body 120/220 by points of glue or other systems.

With particular reference to FIGS. 3, 4 and 5, they illustrate in detail a particular electric field sensor 130/230, wherein said first inner sheet 131/231 is provided with respective through holes defined by a respective perimeter 134/234, said second outer sheet 132/232 is provided with respective through holes defined by a respective perimeter 135/235, wherein said through holes in said first inner sheet 131/231 have a greater amplitude than the through holes in the second outer sheet 132/232, in such a way as to create between said two perimeters 134_135/234_235 (i.e., between said two through holes) an annulus 136/236 of insulating material.

With reference to FIGS. 1 and 2, the capacitive coupling between the source electrode 110/210 and the electric field sensor 130/230 detects the electric field generated by the source electrode 110/210, and the relative signal by the cable 160/260 can be transmitted to a processing device 170/270, for example to estimate the value of the voltage present in said source electrode 110/210.

With reference to the above description, as the electric field sensor 130/230 is formed by a monolithic body comprising at least one first internal sheet 131/231 and a second external sheet 132/232 overlapped and joined together (glued, associated, bound) before of the their insertion into the shielding tubular body 120/220, there is no undesirable delamination dislocation/separation between said two sheets, thus solving the above-mentioned problems as well as solving other problems associated with the assembling of the sensor components before the casting, as the electric filed sensor 130/230 is easily and quickly secured/fixed in position by means of points of glue between the external face 137/237 of the external sheet 132/232 of the electric field sensor 130/230 and the internal face 124/224 of the shielding tubular body 120/220.

With reference to the particular embodiment of FIG. 6, the resin can pass and flow through the holes 133/233 executed in the two sheets 131/231 and 132/232 of the electric field sensor 130/230 during its casting, and some resin can also and flow through the holes 126/226 of the screening tubular body 120/220, and in this manner the characteristics of filling and of gripping of the resin are improved, no undesired vacuoles are formed, and no undesired dislocation/separation shall occur between the shielding body 120/220 and the electric field sensor 130/230, thus solving the above-mentioned problems.

The description of the various embodiments of the constructive system for a capacitive sensor are provided solely by ways of non-limiting example, and clearly, therefore, said system can be modified or varied in any way suggested by experience and/or by its use or application within the scope of the following claims. The following claims also form an integrative part of the above description.

Various features of the invention are set forth in the following claims.

What is claimed is:

1. A capacitive voltage sensor assembly comprising:
a source electrode extending along a longitudinal axis;
a tubular shield surrounding and spaced in a direction radially outward from the longitudinal axis and from a portion of the source electrode, wherein the tubular shield includes a plurality of through holes; and
a circular sensor element positioned radially inward of the tubular shield and including a first layer of electrically conductive material and a second layer of electrically insulating material, wherein the circular sensor element surrounds and is spaced in a direction radially outward from the longitudinal axis and from a portion of the source electrode, and wherein the circular sensor element includes a plurality of through holes each configured as an elongated slit having an axial length extending in a direction parallel to the longitudinal axis.

2. The capacitive voltage sensor assembly of claim 1, further comprising a mass of dielectric insulating material surrounding the tubular shield and the circular sensor element.

3. The capacitive voltage sensor assembly of claim 2, wherein the mass of dielectric insulating material fills the plurality of through holes in the tubular shield and the plurality of through holes in the circular sensor element.

4. The capacitive voltage sensor assembly of claim 1, wherein the source electrode is configured to be connected to a voltage source, and wherein the first layer of electrically conductive material is configured to form a capacitive coupling with the source electrode.

5. The capacitive voltage sensor assembly of claim 1, wherein the second layer of electrically insulating material is configured to electrically isolate the first layer of electrically conductive material from the tubular shield.

6. The capacitive voltage sensor assembly of claim 1, wherein at least one through hole of the plurality of through holes in the circular sensor element is aligned with a through hole in the tubular shield.

7. The capacitive voltage sensor assembly of claim 5, wherein the second layer of electrically insulating material is bonded to the first layer of electrically conductive material and fixed to an inner surface of the tubular shield.

8. The capacitive voltage sensor assembly of claim 5, wherein the tubular shield, the first layer of electrically conductive material, and the second layer of electrically insulating material are arranged coaxially with the longitudinal axis.

9. The capacitive voltage sensor assembly of claim 5, wherein the tubular shield, the first layer of electrically conductive material, and the second layer of electrically insulating material are positioned adjacent the second end of the source electrode and spaced apart from the first end of the source electrode.

10. The capacitive voltage sensor assembly of claim 1, wherein the plurality of holes in the tubular shield is configured as a mesh-like network.

11. The capacitive voltage sensor assembly of claim 1, wherein the plurality of through holes in the circular sensor element includes a first row of circumferentially spaced through holes and a second row of circumferentially spaced through holes and at least one through hole of the first row is aligned with a through hole of the second row in a direction parallel to the longitudinal axis.

12. The capacitive voltage sensor assembly of claim 11, wherein each through hole of the first row of through holes is aligned with a through hole of the second row of through holes in a direction parallel to the longitudinal axis.

13. A capacitive voltage sensor assembly comprising:
an electrode extending along a longitudinal axis;
a tubular shield surrounding and spaced radially outward from a portion of the electrode, wherein the tubular shield includes a plurality of through holes and has a first end and a second end opposite the first end;
a circular sensor element surrounding and spaced in a direction radially outward from the longitudinal axis and from a portion of the electrode and positioned radially inward of the tubular shield, wherein the circular sensor element includes a first layer of electrically conductive material and a second layer of electrically insulating material, and wherein the second layer of electrically insulating material is positioned between the tubular shield and the first layer of electrically conductive material, and wherein the circular sensor element includes a plurality of through holes; and a mass of dielectric material surrounding the tubular shield and the circular sensor element, wherein the mass of dielectric insulating material fills the plurality of through holes in the tubular shield and the plurality of through holes in circular sensor element, and wherein the circular sensor element includes a printed circuit board.

14. The capacitive voltage sensor assembly of claim 13, wherein the tubular shield has a first dimension in a direction extending along the longitudinal axis and the circular sensor element has a second dimension in a direction extending along the longitudinal axis that is less than the first dimension of the tubular shield.

15. The capacitive voltage sensor assembly of claim 13, wherein a first end of the tubular shield is positioned between a first end and a second end of the electrode and a second end of the tubular shield is not positioned between the first and second ends of the electrode.

16. The capacitive voltage sensor assembly of claim 13, wherein the circular sensor element is flexible.

17. The capacitive voltage sensor assembly of claim 13, wherein each through hole of the plurality of through holes in the circular sensor element has a length that extends in a direction parallel to the longitudinal axis.

18. A capacitive voltage sensor assembly comprising:
a source electrode extending along a longitudinal axis;
a tubular shield surrounding and spaced radially outward from a portion of the source electrode, wherein the tubular shield includes a plurality of through holes configured in a mesh-like network, wherein the tubular shield has a first end and a second end opposite the first end;
a circular sensor element positioned radially inward of the tubular shield, wherein the circular sensor element includes a first layer of electrically conductive material and a second layer of electrically insulating material positioned between the tubular shield and the first layer of electrically conductive material, wherein the circular sensor element includes a plurality of through holes, and wherein each through hole of the plurality of through holes has a length that extends in a direction parallel to the longitudinal axis,
wherein the first layer of electrically conductive material is configured to form a capacitive coupling with the source electrode,
wherein the second layer of electrically insulating material is configured to electrically isolate the first layer of electrically conductive material from the tubular shield, and
wherein the source electrode includes a first portion having a first diameter transverse to the longitudinal axis and a second portion that extends from the first portion in a direction parallel to the longitudinal axis, wherein the second portion has a second diameter transverse to the longitudinal axis, and wherein the first diameter is greater than the second diameter.

19. The capacitive voltage sensor assembly of claim 18, further comprising a mass of dielectric insulating material surrounding the tubular shield and the circular sensor element.

20. The capacitive voltage sensor assembly of claim 19, wherein the mass of dielectric insulating material fills the plurality of through holes in the tubular shield and the plurality of through holes in the circular sensor element.

21. The capacitive voltage sensor assembly of claim 18, wherein the tubular shield and circular sensor element are arranged coaxially with the longitudinal axis.

22. The capacitive voltage sensor assembly of claim 18, wherein the second layer of electrically insulating material is fixed to an inner surface of the tubular shield.

23. The capacitive voltage sensor assembly of claim 18, wherein the second layer of electrically insulating material is configured to electrically isolate the first layer of electrically conductive material from the tubular shield.

24. A capacitive voltage sensor assembly comprising:
an electrode extending along a longitudinal axis;
a tubular portion comprising a printed circuit board and including a layer of electrically insulating material, a layer of electrically conductive material positioned radially inward of the layer of electrically insulating material in a direction toward the longitudinal axis, and an outer shield positioned radially outward of the layer of electrically insulating material in a direction away from the longitudinal axis; and
a mass of dielectric insulating resin at least partially encapsulating the electrode and the tubular portion, wherein the mass of dielectric resin fills through holes formed in the layer of electrically insulating material and the layer of electrically conductive material, wherein the through holes are configured as elongated slits that have a length extending in a direction parallel to the longitudinal axis, wherein each through hole in the layer of electrically conductive material is aligned with a through hole in the layer of electrically insulating material, and wherein each through hole in the layer of electrically conductive material has a first perimeter and each through hole in the layer of electrically insulating material has a second perimeter, and wherein the first perimeter is greater than the second perimeter.

25. The capacitive voltage sensor assembly of claim 24, wherein the mass of dielectric resin forms a unitary insulating carrier structure for the electrode and the tubular portion.

26. The capacitive voltage sensor assembly of claim 24, wherein the electrode is configured to act as a source electrode, and wherein the layer of electrically conductive material is configured to form a capacitive coupling as an electric field sensor with the source electrode.

27. The capacitive voltage sensor assembly of claim 24, wherein the layer of electrically conductive material is positioned intermediate between a first axial end of the tubular portion and a second opposite end of the tubular portion.

28. The capacitive voltage sensor assembly of claim 24, wherein the outer shield includes a plurality of through holes configured in a mesh-like network.

29. The capacitive sensor of claim 24, wherein outer shield has a first dimension in a direction extending along the longitudinal axis and the layer of electrically conductive material has a second dimension in a direction extending along the longitudinal axis that is less than the first dimension of the outer shield.

30. The capacitive sensor of claim 24, wherein each through hole in the inner layer of electrically conductive material is aligned with a through hole in the layer of electrically insulating material such that an annulus of dielectric insulating resin is formed between each pair of the aligned through holes in the layer of electrically conductive material and the layer of electrically insulating material.

31. The capacitive sensor of claim 24, wherein the layer of electrically insulating material is configured to support the layer of electrically conductive material.

32. The capacitive sensor of claim 24, wherein the layer of electrically insulating material and the layer of electrically conductive material form a monolithic body.

33. The capacitive sensor of claim 24, wherein each through hole in the layer of electrically conductive material and each through hole in the layer of electrically insulating material is configured as an elongated slit having an axial length extending in a direction parallel to the longitudinal axis.

34. A capacitive voltage sensor assembly comprising:
an electrode extending along a longitudinal axis;
a tubular shield surrounding and spaced in a direction radially outward from the longitudinal axis and from a portion of the electrode;
a circular sensor element positioned radially inward of the tubular shield, wherein the circular sensor element includes a first layer of electrically conductive material and a second layer of electrically insulating material, wherein the circular sensor element surrounds and is spaced in a direction radially outward from the longitudinal axis and from a portion of the electrode, wherein the first layer of electrically conductive material includes a first plurality of through holes comprising a first row of circumferentially spaced through holes and a second row of circumferentially spaced through holes, wherein at least one through hole of the first row is aligned with a through hole of the second row in a direction parallel to the longitudinal axis, wherein the second layer of electrically insulating material includes a second plurality of through holes comprising a first row of circumferentially spaced through holes and a second row of circumferentially spaced through holes, wherein at least one through hole of the first row is aligned with a through hole of the second row in a direction parallel to the longitudinal axis, and wherein at least one through hole of the first plurality of through holes is aligned with a through hole of the second plurality of through holes; and
a mass of dielectric material surrounding the tubular shield and the circular sensor element, wherein the mass of dielectric insulating material fills the first plurality of through holes and the second plurality of through holes in the circular sensor element.

35. The capacitive voltage sensor assembly of claim 34, further comprising a printed circuit board.

36. The capacitive voltage sensor assembly of claim 35, wherein the tubular shield includes a third plurality of through holes and the mass of dielectric insulating material fills the third plurality of through holes in the tubular shield.

37. The capacitive voltage sensor assembly of claim 36, wherein the third plurality of through holes in the tubular shield is configured as a mesh-like network.

38. The capacitive voltage sensor assembly of claim 36, wherein each through hole of the second plurality of through holes is aligned with a through hole of the third plurality of through holes.

39. The capacitive voltage sensor assembly of claim 34, wherein the circular sensor element comprises a printed circuit board.

40. The capacitive sensor element of claim 34, wherein the first plurality of through holes of the first layer of electrically conductive material and the second plurality of through holes of the second layer of electrically insulating material are configured as elongated slits that have a length extending in a direction parallel to the longitudinal axis.

41. The capacitive sensor element of claim 34, wherein each through hole of the first plurality of through holes of the first layer of electrically conductive material is aligned with a through hole of the second plurality of through holes of the second layer of electrically insulating material, wherein each through hole of the first plurality of through holes of the first layer of electrically conductive material has a first perimeter and each through hole of the second plurality of through holes of second layer of electrically insulating material has a second perimeter, and wherein the first perimeter is greater than the second perimeter such that an annulus of dielectric insulating resin is formed between each pair of the aligned through holes in the first layer of electrically conductive material and the second layer of electrically insulating material.

42. The capacitive sensor of claim 41, wherein each through hole of the first plurality of through holes of the first layer of electrically conductive material and each through hole of the second plurality of through holes of the second layer of electrically insulating material is configured as an elongated slit having an axial length extending in a direction parallel to the longitudinal axis.

* * * * *